(12) United States Patent
Trifonov

(10) Patent No.: US 7,595,676 B2
(45) Date of Patent: Sep. 29, 2009

(54) COMPARATOR AND METHOD WITH CONTROLLABLE THRESHOLD AND HYSTERESIS

(75) Inventor: Dimitar T. Trifonov, Vail, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 149 days.

(21) Appl. No.: 11/880,582

(22) Filed: Jul. 23, 2007

(65) Prior Publication Data

US 2009/0027086 A1 Jan. 29, 2009

(51) Int. Cl.
*H03K 3/00* (2006.01)
(52) U.S. Cl. ...................... 327/206; 327/205
(58) Field of Classification Search ............... 327/205, 327/206
See application file for complete search history.

(56) References Cited

U.S. PATENT DOCUMENTS

| | | | | | |
|---|---|---|---|---|---|
| 4,511,810 | A | * | 4/1985 | Yukawa | 327/63 |
| 5,404,054 | A | * | 4/1995 | Kotowski | 327/73 |
| 5,517,134 | A | * | 5/1996 | Yaklin | 327/65 |
| 5,528,185 | A | * | 6/1996 | Lewicki et al. | 327/206 |
| 5,831,566 | A | * | 11/1998 | Ginetti | 341/144 |
| 6,060,912 | A | * | 5/2000 | Opris et al. | 327/57 |
| 6,087,873 | A | * | 7/2000 | Alexander | 327/206 |
| 6,127,854 | A | * | 10/2000 | Illegems | 327/66 |
| 6,140,872 | A | * | 10/2000 | McEldowney | 330/9 |
| 6,826,390 | B1 | * | 11/2004 | Tamura | 455/226.1 |
| 7,187,223 | B2 | * | 3/2007 | Yeo et al. | 327/206 |
| 2004/0258183 | A1 | * | 12/2004 | Popescu et al. | 375/350 |
| 2005/0218986 | A1 | * | 10/2005 | Garlepp et al. | 330/259 |

\* cited by examiner

*Primary Examiner*—Lincoln Donovan
*Assistant Examiner*—Thomas J Hiltunen
(74) *Attorney, Agent, or Firm*—John J. Patti; Wade J. Brady, III; Frederick J. Telecky, Jr.

(57) ABSTRACT

A comparator (12A,12B) includes a first differential input stage (10) including first (MN2) and second (MN3) input transistors and a load (MP9,MP10), the first input transistor (MN2) having a gate, source, and drain coupled to a first input voltage (Vin⁻), a first tail current source, and the load, respectively. The second input transistor has a gate and source coupled to a second input voltage (Vin⁺) and a first tail current source. A second differential input stage (11) includes a third (MN4) and fourth (MN5) input transistors, the third input transistor having a gate and source coupled to a first reference voltage (Vref⁺) and the second tail current source, respectively. The fourth input transistor (MN5) has a gate and a source coupled to a second reference voltage (Vref⁻) and the second tail current source, respectively. Drains of the third and fourth input transistors are coupled to the load. An output stage (6A) produces a comparator output voltage (Vout) in response to an output (V2) produced by the first and second (11) differential input stages. A switching threshold of the comparator is determined by a difference between the first and second reference voltages.

14 Claims, 3 Drawing Sheets

COMPARATOR AND METHOD WITH CONTROLLABLE THRESHOLD AND HYSTERESIS

BACKGROUND OF THE INVENTION

The present invention relates generally to comparators, and more particularly to differential comparators having controllable threshold voltages and/or controllable hysteresis.

FIG. 1 shows a conventional comparator 1 that includes an input stage 10 with N-channel input transistors MN2 and MN3 having their gates coupled to receive input voltages Vin⁻ and Vin⁺, respectively, and having their sources connected to one terminal of a bias current source 16, the other terminal of which is connected to $V_{SS}$. The drain of transistor MN2 is connected by conductor 2 to the gate and drain of P-channel current mirror input transistor MP10 and to the gate of P-channel current mirror output transistor MP9, the sources of which are connected to $V_{DD}$. The drain of current mirror output transistor MP9 is connected by conductor 3 to the drain of input transistor MN3. Comparator 1 also includes an output stage 6 which includes P-channel input transistors MP13 and MP14 having their sources connected to $V_{DD}$ and having their gates connected to conductors 2 and 3, respectively. The drain of transistor MP13 is connected by conductor 4 to the drain and gate of N-channel current mirror input transistor MN0 and the gate of N-channel current mirror output transistor MN1, the sources of which are connected to $V_{SS}$. The drain of current mirror output transistor MN1 is connected by conductor 5 to the drain of transistor MP14 and to the input of an inverter 7. The output of inverter 7 is connected by conductor 9 to the input of an inverter 8 and also to the gate of a N-channel hysteresis feedback transistor MN27, the drain of which is connected to conductor 2 and the source of which is connected to one terminal of a hysteresis current source 18 having its other terminal connected to $V_{SS}$.

Transistor MN27 performs the function of providing positive feedback to introduce hysteresis into the comparator. The hysteresis current I1 is much lower than the bias current I0. The ratio of the two currents I1 and I0 determines the amount of hysteresis. Inverters 7 and 8 provide additional gain to sharpen the edges of the comparator output signal.

The switching threshold voltage, or simply the "threshold", of a comparator is the value of the input voltage or differential input voltage at which the comparator changes state. The hysteresis of a comparator is the difference between the input voltage at which a comparator switches in one direction and the input voltage at which the comparator switches in the opposite direction.

The threshold voltage of conventional differential comparator 1 of FIG. 1 is equal or very nearly equal to zero. The circuit shown in FIG. 1 changes state when the differential input voltage is very close to or exactly equal to zero. It has a non-symmetrical hysteresis created by injecting the typically relatively small current I1 into the input of a current mirror load circuit MP9,MP10.

By way of background, it should be noted that the technique of using two or more pairs of differentially coupled input transistors and their associated tail current sources has been commonly used in design of various amplifiers, for example to provide various ways of auto-zeroing, but it is believed that this technique has not been used to establish an adjustable switching threshold voltage and/or an adjustable amount of hysteresis in a comparator.

If a conventional comparator, for example comparator 1 of FIG. 1, is used as a component in a system, there frequently is a need for it to have a well controlled threshold that is different from zero. For example, a window comparator in an ADC (analog to digital converter) typically is formed from two comparators, one with a positive threshold and the other with a negative threshold. It would be desirable to be able to precisely control the threshold and/or hysteresis of a comparator, because that could significantly simplify the electronic circuitry and provide functions that otherwise would require additional sub-modules. For example, it may be desirable to have a comparator that changes state at a threshold of approximately 100 millivolts. Or it may be desirable to have a window comparator that, in effect, has 3 states, namely +1, 0, and –1, such that the comparator switches to the "+1" state when the differential input voltage is above +100 millivolts, and can be considered to be in the "0" condition when the differential input voltage is between +100 millivolts and –100 millivolts, and can be considered to be in the "–1" state when the differential input voltage is below –100 millivolts.

Since conventional comparators only have a threshold that is very close to or exactly equal to 0 volts, the only known practical way to provide a window comparator has been to modify the thresholds of its two conventional comparators by scaling the geometries of various transistors therein such that one of the comparators changes state when the differential input voltage is at, for example, +100 millivolts and the other comparator changes state when the differential input voltage is at, for example, –100 millivolts. This approach has the shortcoming that it results in wide threshold and/or hysteresis variations with respect to temperature changes and/or manufacturing process variations. And of course, once a particular threshold is designed into a conventional comparator by scaling various transistor geometries, it cannot be easily changed.

Most known hysteresis circuits in comparators use a signal from the comparator output to control a voltage or current inside the comparator in one direction or the other so as to imbalance the circuit to provide a desired fixed amount of hysteresis.

There is an unmet need for a comparator in which a non-zero threshold can be achieved without mismatching various transistor geometries therein.

There also is an unmet need for a comparator in which the threshold can be adjusted.

There also is an unmet need for a comparator having adjustable hysteresis.

There also is an unmet need for a comparator having adjustable threshold and adjustable hysteresis.

There also is an unmet need for a comparator and method wherein the threshold can be varied during comparator operation.

There also is an unmet need for a comparator and method wherein both the threshold and hysteresis of the comparator can be adjusted during comparator operation.

SUMMARY OF THE INVENTION

It is an object of the invention to provide a comparator in which a non-zero threshold can be achieved without mismatching various transistor geometries therein.

It is another object of the invention to provide a comparator in which the threshold can be adjusted.

It is another object of the invention to provide a comparator having adjustable hysteresis.

It is another object of the invention to provide a comparator having adjustable threshold and adjustable hysteresis.

It is another object of the invention to provide a comparator and method wherein the threshold can be varied during comparator operation.

It is another object of the invention to provide a comparator and method wherein both the threshold and hysteresis of the comparator can be adjusted during comparator operation.

Briefly described, and in accordance with one embodiment, the present invention provides a comparator (12A,12B) including a first differential input stage (10) including first (MN2) and second (MN3) input transistors, a first tail current source (16), and a first load circuit (MP9,MP10), the first input transistor (MN2) having a control electrode coupled to a first input voltage (Vin⁻), a first electrode coupled to the first tail current source, and a second electrode coupled to the load circuit. The second input transistor has a control electrode coupled to receive a second input voltage (Vin⁺), a first electrode coupled to the first tail current source, and a second electrode coupled to the first load circuit. A second differential input stage (11) includes third (MN4) and fourth (MN5) input transistors, and a second tail current source (17), the third input transistor having a control electrode coupled to a first reference voltage (Vref⁺) and a first electrode coupled to the second tail current source. The fourth input transistor (MN5) has a control electrode coupled to receive a second reference voltage (Vref⁻) and a first electrode coupled to the second tail current source. Second electrodes of the third and fourth input transistors are coupled to the first load circuit. An output stage (6A) produces a comparator output voltage (Vout) in response to an output (V2) produced by the first and second (11) differential input stages. A switching threshold of the comparator is determined by a difference between the first and second reference voltages.

In one embodiment, the invention provides a comparator (12A,B) including a first differential input stage (10) including first (MN2) and second (MN3) input transistors, a first tail current source (16) conducting a first tail current (I0), and a first load circuit (MP9,MP10). The first input transistor (MN2) has a control electrode coupled to receive a first input voltage (Vin⁻), a first electrode coupled to the first tail current source (16), and a second electrode coupled to the load circuit (MP9,MP10). The second input transistor (MN3) has a control electrode coupled to receive a second input voltage (Vin⁺), a first electrode coupled to the first tail current source (16), and a second electrode coupled to the first load circuit (MP9,MP10). A second differential input stage (11) includes third (MN4) and fourth (MN5) input transistors, and a second tail current source (17) conducting a second tail current (I2). The third input transistor (MN4) has a control electrode coupled to receive a first reference voltage (Vref⁺), a first electrode coupled to the second tail current source (17), and a second electrode coupled to the first load circuit (MP9, MP10). The fourth input transistor (MN5) has a control electrode coupled to receive a second reference voltage (Vref⁻), a first electrode coupled to the second tail current source (17), and a second electrode coupled to the first load circuit (MP9, MP10). An output stage (6A) produces a comparator output voltage (Vout) and has an input (3) coupled to receive an output (V2) produced by the first (10) and second (11) differential input stages. A switching threshold of the comparator (12A,B) is determined by a difference between the first (Vref⁺) and second (Vref⁻) reference voltages.

In one embodiment, an amount of hysteresis of the comparator is partly determined by a control circuit (S1,S2 in FIG. 2 or 23 in FIG. 3) having a first input coupled to receive feedback from the comparator output voltage (Vout) and a second input coupled to receive information representative of the amount of hysteresis. The control circuit also has an output (24) coupled to produce at least one of the first (Vref⁺) and second (Vref⁻) reference voltages.

In one embodiment, an amount of a switching threshold voltage of the comparator is partly determined by a ratio between the current (I0) produced by the first tail current source (16) and the current (I2) produced by the second tail current source (17). In one embodiment, an amount of hysteresis of the comparator is partly determined by a ratio between the current (I0) produced by the first tail current source (16) and the current (I2) produced by the second tail current source (17).

In one embodiment, the amount of a switching threshold voltage of the comparator is partly determined by a ratio between the current (I0) produced by the first tail current source (16) and the current (I2) produced by the second tail current source (17), and an amount of hysteresis of the comparator is also partly determined by the ratio between the current (I0) produced by the first tail current source (16) and the current (I2) produced by the second tail current source (17).

In a described embodiment, the first load circuit includes a first current mirror. The first current mirror includes a first P-channel current mirror input transistor (MP10) having a gate and drain coupled to a drain of the first input transistor (MN2) and to a gate of a first P-channel current mirror output transistor (MP9) having a drain coupled to a drain of the second input transistor (MN3) and to an input of the output circuit (6A).

In one embodiment, the output circuit (6A) includes a second load circuit. The second load circuit includes a N-channel second current mirror input transistor (MM0) having a gate and drain coupled to a drain of a P-channel fifth input transistor (MP13) and to a gate of a N-channel second current mirror output transistor (MN1) having a drain coupled to a drain of a P-channel sixth input transistor (MP14).

In one embodiment, first (R2) and second (R3) degeneration resistors are coupled between the first tail current source (16) and the first electrodes of the first (MN2) and second (MN3) input transistors, respectively, and third (R0) and fourth (R1) degeneration resistors are coupled between the second tail current source (17) and the first electrodes of the third (MN4) and fourth (MN5) input transistors, respectively, to ensure operation of the first, second, third, and fourth input transistors in their linear regions.

In one embodiment, the control electrodes of the third (MM4) and fourth (MN5) input transistors are coupled to outputs of a digital to analog converter (14) having an input coupled to the output (24) of the control circuit (23), the digital to analog converter (14) generating the first (Vref⁺) and second (Vref⁻) reference voltages. The control circuit (23) generates a digital code on its output (24) representative of a value of the switching threshold. The control circuit (23) generates a first digital code on its output (24) representative of the value of the switching threshold plus half of a hysteresis voltage value in response to a first value of the comparator output voltage (Vout) and generates a second digital code on its output (24) representative of the value of the switching threshold minus half of the hysteresis voltage value in response to a second value of the comparator output voltage (Vout).

In one embodiment, the invention provides a method for operating a comparator (12A,12B) including a first differential input stage (10) including first (MN2) and second (MN3) input transistors, a first tail current source (16) and conducting a first tail current (I0), and a first load circuit (MP9, MP10), the first input transistor (MN2) having a control electrode coupled to receive a first input voltage (Vin⁻), a first electrode coupled to the first tail current source (16), and a second electrode coupled to the load circuit (MP9,MP10), the second input transistor (MN3) having a control electrode coupled to receive a second input voltage (Vin⁺), a first electrode coupled to the first tail current source (16), and a second electrode coupled to the first load circuit (MP9,MP10), wherein the method includes providing a second differential input stage (11) including third (MN4) and fourth (MN5) input transistors, and a second tail current source (17) conducting a second tail current (I2), the third input transistor (MN4) having a control electrode coupled to receive a first reference voltage (Vref⁺) and a first electrode coupled to the second tail current source (17), the fourth input transistor (MN5) having a control electrode coupled to receive a second reference voltage (Vref⁻) and a first electrode coupled to the second tail current source (17), coupling a second electrode of the third input transistor (MN4) to the first load circuit (MP9, MP10) and coupling a second electrode of the fourth input transistor (MN5) to the first load circuit (MP9,MP10), and coupling an input (3) of an output stage (6A) producing a comparator output voltage (Vout) to receive an output (V2) produced by the first (10) and second (11) differential input stages, a switching threshold of the comparator (12A,B) being determined by a difference between the first (Vref⁺) and second (Vref⁻) reference voltages.

In one embodiment, the method includes determining an amount of hysteresis of the comparator in response to switching of the comparator by coupling a first input of a control circuit (S1,S2 in FIG. 2 or 23 in FIG. 3) to receive the comparator output voltage (Vout) and coupling a second input of the control circuit to receive information representative of the amount of hysteresis, and causing an output (24) of the control circuit to generate at least one of the first (Vref⁺) and second (Vref⁻) reference voltages.

In one embodiment, the method includes operating the control circuit (23) to generate a first digital code representative of a value of the switching threshold plus half of a hysteresis voltage value on the output (24) of the control circuit (23) in response to generation of a first value of the comparator output voltage (Vout) representative of a first state of the comparator, and operating the control circuit (23) to generate a second digital code representative of the value of the switching threshold minus half of the hysteresis voltage value on the output (24) of the control circuit (23) in response to generation of a second value of the output voltage (Vout) representative of a second state of the comparator.

In one embodiment, the invention provides comparator (12A,12B) including a first differential input stage (10) including first (MN2) and second (MN3) input transistors, a first tail current source (16) and conducting a first tail current (I0), and a first load circuit (MP9,MP10), the first input transistor (MN2) having a control electrode coupled to receive a first input voltage (Vin⁻), a first electrode coupled to the first tail current source (16), and a second electrode coupled to the load circuit (MP9,MP10), the second input transistor (MN3) having a control electrode coupled to receive a second input voltage (Vin⁺), a first electrode coupled to the first tail current source (16), and a second electrode coupled to the first load circuit (MP9,MP10). A second differential input stage (11) includes third (MN4) and fourth (MN5) input transistors, and a second tail current source (17) conducting a second tail current (I2), the third input transistor (MN4) having a control electrode coupled to receive a first reference voltage (Vref⁺) and a first electrode coupled to the second tail current source (17), the fourth input transistor (MN5) having a control electrode coupled to receive a second reference voltage (Vref⁻) and a first electrode coupled to the second tail current source (17). The comparator also includes means for coupling a second electrode of the third input transistor (MN4) to the first load circuit (MP9,MP10) and coupling a second electrode of the fourth input transistor (MN5) to the first load circuit (MP9,MP10), and means for coupling an input (3) of an output stage (6A) producing a comparator output voltage (Vout) to receive an output (V2) produced by the first (10) and second (11) differential input stages, a switching threshold of the comparator (12A,B) being determined by a difference between the first (Vref⁺) and second (Vref⁻) reference voltages. In one embodiment, the comparator includes means for operating the control circuit (23) to generate a first digital code representative of a value of the switching threshold plus half of a hysteresis voltage value on the output (24) of the control circuit (23) in response to generation of a first value of the comparator output voltage (Vout) representative of a first state of the comparator, and for operating the control circuit (23) to generate a second digital code representative of the value of the switching threshold minus half of the hysteresis voltage value on the output (24) of the control circuit (23) in response to generation of a second value of the output voltage (Vout) representative of a second state of the comparator.

BRIEF DESCRIPTION OF THE DRAWINGS

FIG. 4 is a graph illustrating adjustable threshold and adjustable hysteresis in the comparators of FIGS. 2 and 3.

DETAILED DESCRIPTION OF THE PREFERRED EMBODIMENTS

Figure 1:
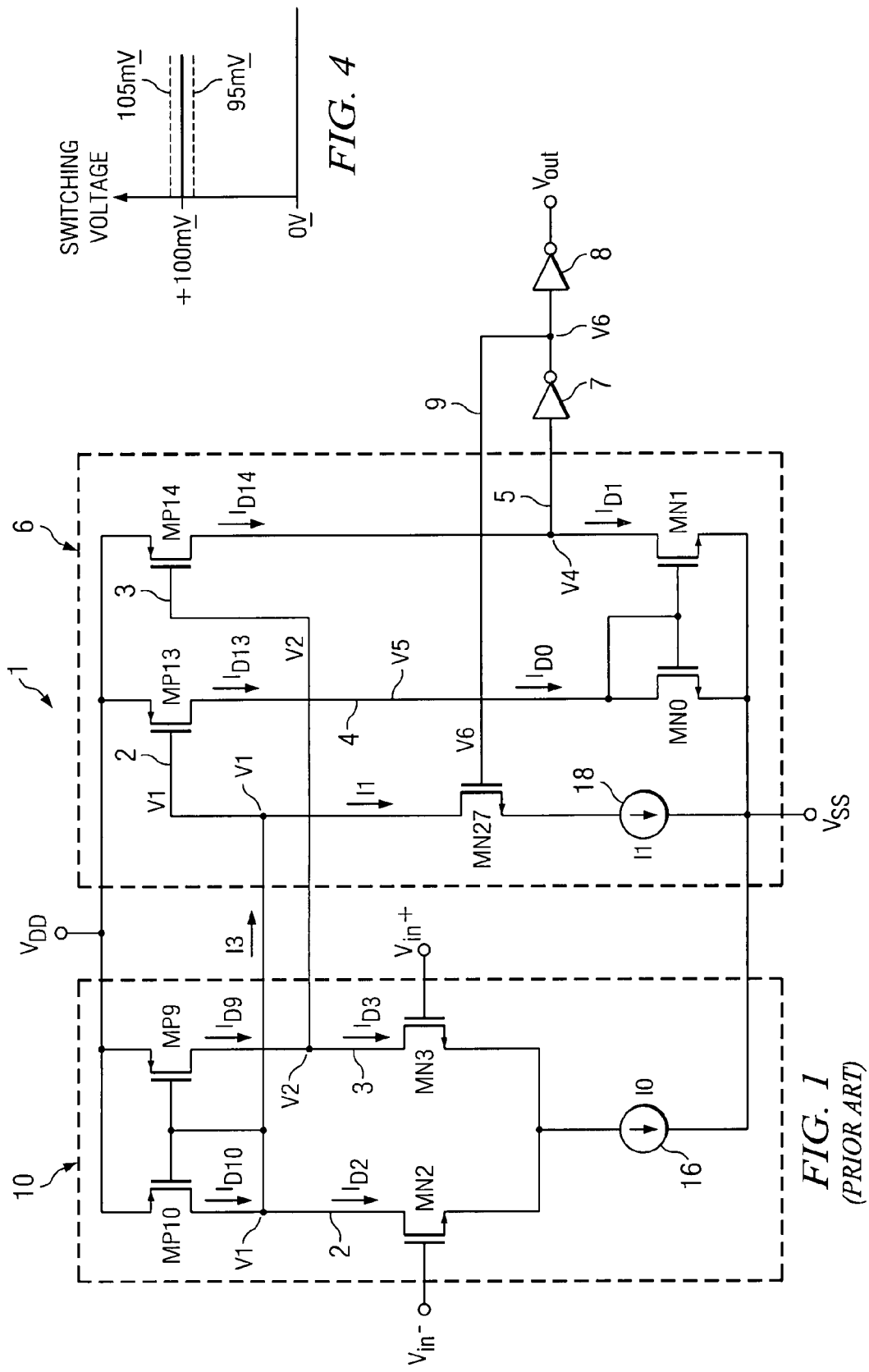
FIG. 1 is a schematic diagram of a conventional comparator.
Figure 2:
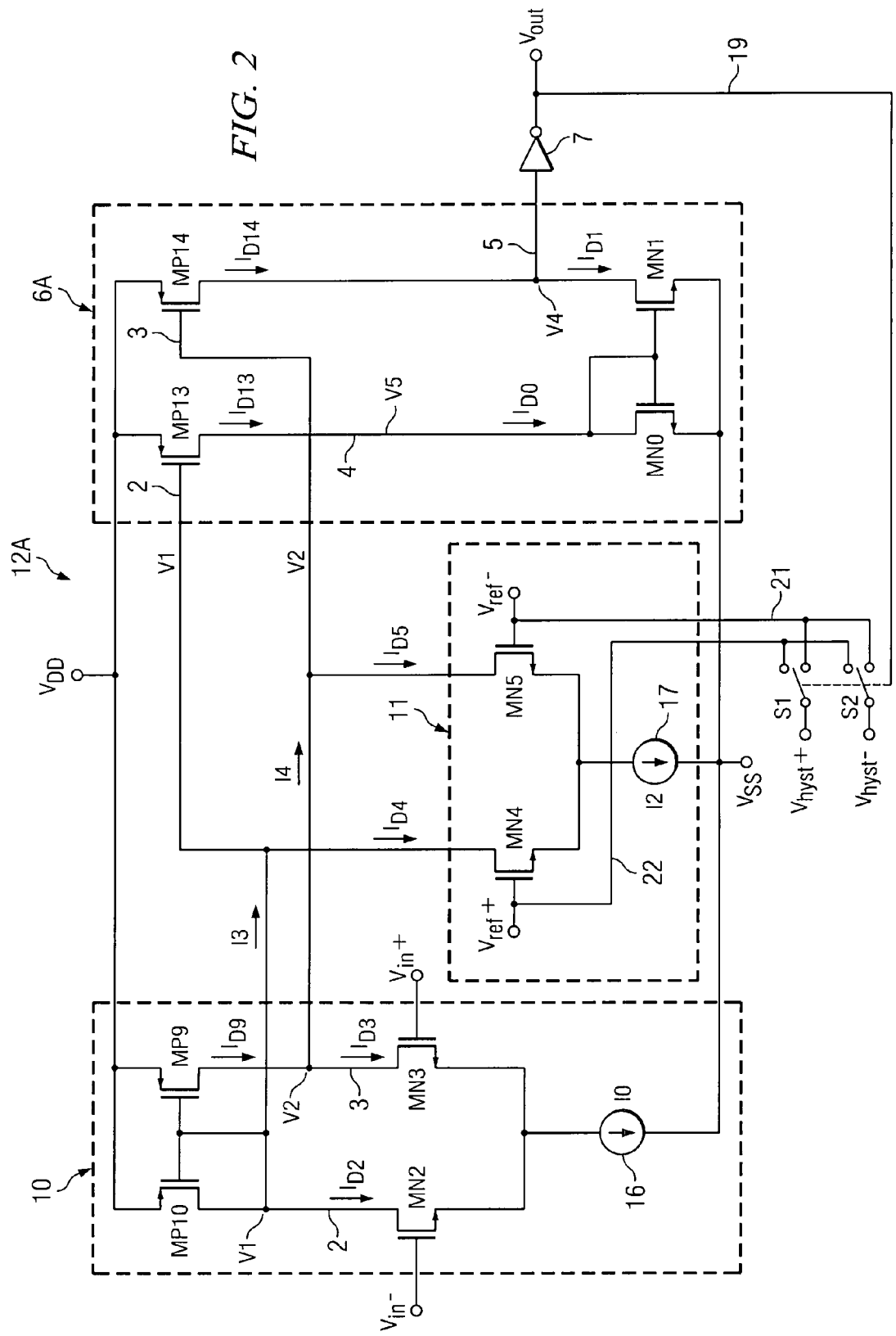
FIG. 2 is a schematic diagram of a comparator according to the present invention.

The invention provides a dual input stage comparator, a simplified schematic of which is shown in FIG. 2, wherein comparator 12A includes a first stage 10 including N-channel input transistors MN2 and MN3 having their gates coupled to receive input voltages Vin⁻ and Vin⁺, respectively, and their sources connected to one terminal of a bias current source 16, the other terminal of which is connected to $V_{SS}$. Bias current source 16 conducts a bias current I0. The drain of transistor MN2 is connected by conductor 2 to the gate and drain of P-channel current mirror input transistor MP10 and to the gate of P-channel current mirror output transistor MP9, the sources of which are connected to $V_{DD}$. The drain of current mirror output transistor MP9 is connected by conductor 3 to the drain of input transistor MN3.

Comparator 12A also includes a second stage 11 including N-channel input transistors MN4 and MN5 having their gates coupled to receive reference voltages Vref⁺ and Vref⁻, respectively, and having their sources connected to one terminal of a current source 17, the other terminal of which is connected to $V_{SS}$. Current source 17 conducts a current I2. The drains of input transistors MN4 and MN5 are connected to conductors 2 and 3, respectively.

Comparator 12A also includes an output stage 6A which includes P-channel input transistors MP13 and MP14 having their sources connected to $V_{DD}$ and their gates connected to conductors 2 and 3, respectively. The drain of transistor MP13 is connected by conductor 4 to the drain and gate of N-channel current mirror input transistor MN0 and the gate of N-channel current mirror output transistor MN1, the sources of which are connected to $V_{SS}$. The drain of current mirror output transistor MN1 is connected by conductor 5 to the drain of transistor MP14 and to the input of a buffer 7 that operates to shape or sharpen the edges of the comparator output signal Vout on conductor 19.

A voltage level $Vhyst^+$ is coupled to the pole terminal of a switch S1 and another voltage level $Vhyst^-$ is coupled to the pole terminal of a switch S2. A first terminal of each of switches S1 and S2 is connected by conductor 22 to the gate of input transistor MN4 of stage 11, and a second terminal of each of switches S1 and S2 is connected by conductor 21 to the gate of input transistor MN5. The control terminals of switches S1 and S2 are coupled by conductor 19 to Vout.

If the differential input voltage $Vin=Vin^+-Vin^-$ is applied to input stage 10 while the differential threshold reference voltage $Vref=Vref^+-Vref^-$ is applied to input stage 11, then comparator 12A switches at the threshold reference voltage level determined by the voltage difference $Vref=Vref^+-Vref^-$. For example, a differential reference voltage $Vref=Vref^+-Vref^-$ of about +100 millivolts can be applied between the gates of input transistors MN4 and MN5. This creates a threshold such that comparator 12A switches if differential input voltage $Vin=Vin^+-Vin^-$ exceeds 100 millivolts, as illustrated in FIG. 4.

It should be noted that bias current I0 and the threshold adjustment current I2 can have a ratio of 1:1 if no scaling between the input voltage and the reference threshold voltage is desired, but if such scaling is desired, then I0 and I2 are set to a ratio other than 1:1 (assuming that the input transistor geometries in stages 10 and 11 are equal and that I0 and I2 are equal). Additional scaling also can be achieved by designing the input pair transistors in input stages 10 and 11 to have different transconductances. However, this technique entails some degradation in the accuracy of the switching threshold.

To create hysteresis about the switching threshold voltage established by the difference between $Vref^+$ and $Vref^-$, it is necessary to have feedback from the output Vout of comparator 12A to indicate the direction of its previous switched state. As an example, assume that the comparator output voltage Vout is initially at 0 volts and that switches S1 and S2 are initially in a predetermined initial state wherein $Vhyst^+$ and $Vhyst^-$ are coupled to conductors 22 and 21, respectively, and also assume that $Vhyst^+$ is equal to +2.5 millivolts and $Vhyst^-$ is equal to −2.5 millivolts. The +2.5 millivolt level then is applied by conductor 22 to the input of transistor MN4 and the −2.5 millivolt level is applied by conductor 21 to the input of transistor MN5. Then it is necessary for Vin+ to increase to a level slightly above +5 millivolts to cause comparator 12A to switch from a "0" to a "1" logic level.

When the foregoing switching of comparator 12A from a "0" to a "1" occurs, the feedback of Vout via conductor 19 to the control terminals of switches S1 and S2 switches them to their opposite states so that the +2.5 millivolt level is applied to the gate of transistor MN5 and the −2.5 millivolt level is applied to the gate of transistor MN4. In this case, it is necessary for Vin+ to decrease to a level slightly below −5 millivolts to cause comparator 12A to switch from the "1" level back to the "0" logic level.

In the foregoing example, the threshold of comparator 12A is set to 0 volts and its hysteresis is set to 10 millivolts. However, if the $Vhyst^+$ is added to an "average" switching threshold voltage value of 100 millivolts and $Vhyst^-$ is subtracted from the average switching threshold voltage value of 100 millivolts, the result is that comparator 12A is set to have an average switching threshold voltage of 100 millivolts and a hysteresis of 10 millivolts centered about the 100 millivolts average switching threshold voltage of the upper and lower switching threshold voltages. Comparator 12A then will switch from a "0" to a "1" when Vin increases to have a value at or slightly above 105 millivolts and will switch from a "1" to a "0" when Vin decreases to a value of at or slightly below the 95 millivolts, as indicated in FIG. 4.

Thus, the feedback of Vout can be used along with the hysteresis control voltages $Vhyst^+$ and $Vhyst^-$ to create and control hysteresis in comparator 12A. And as subsequently explained with reference to FIG. 3, the above described the threshold voltage and/or hysteresis can be changed dynamically, i.e., changed "on the fly".

In order to achieve well controlled in comparator switching thresholds, the two input transistor pairs MN2,MN3 and MN4,MN5 should be operated in their linear regions. For small values in the difference between $Vref^+$ and $Vref^-$, e.g., difference values less than approximately 50 millivolts, comparator 12A as shown in FIG. 2 is very accurate. However, for larger values of the difference between $Vref^+$ and $Vref^-$ it is necessary to degenerate the input transistors in stages 10 and 11 in order to ensure that the various input transistors operate in their linear regions so as to achieve maximum accuracy of the comparator switching voltage or trip voltage.

Figure 3:
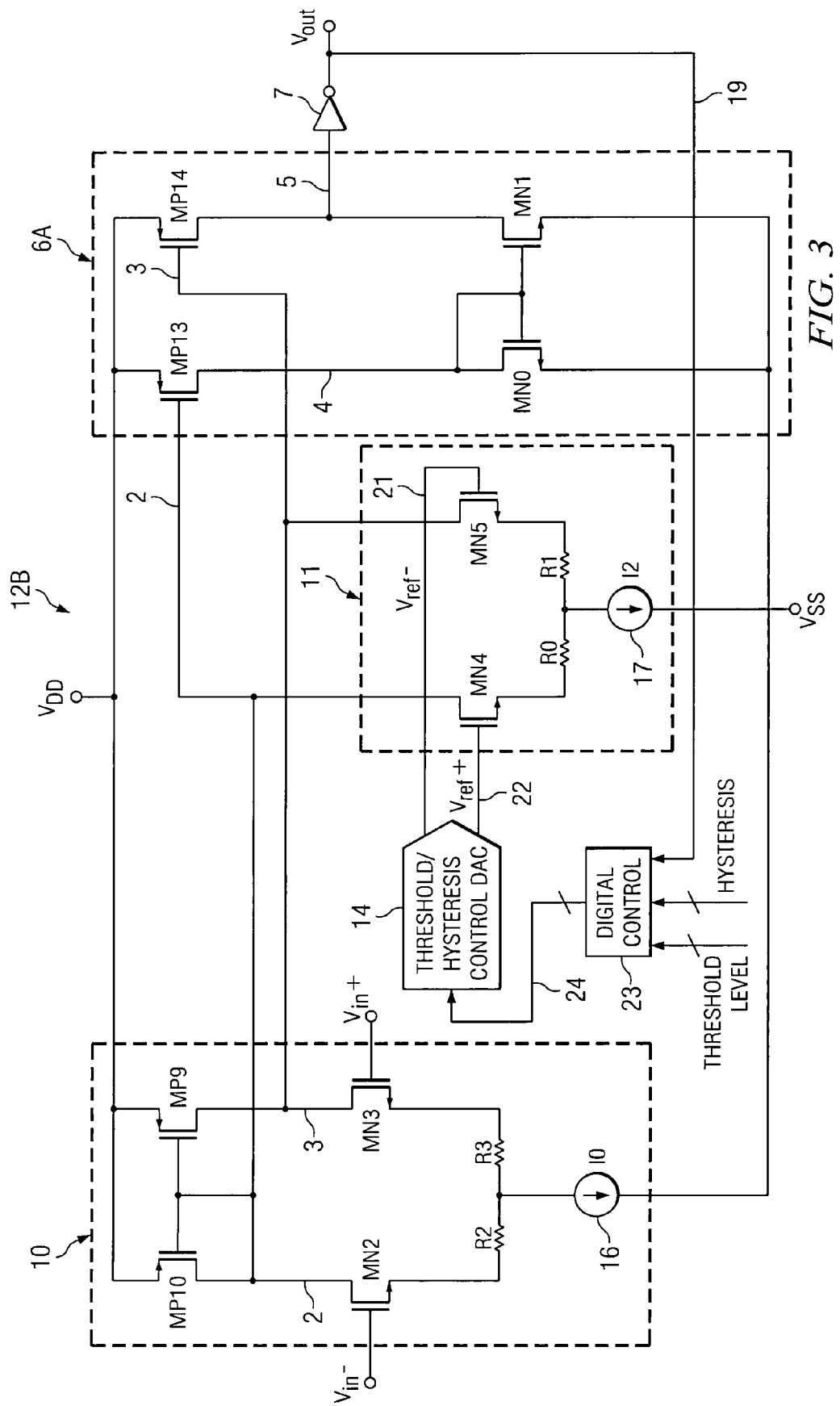
FIG. 3 is a schematic diagram of another comparator according to the present invention.

Referring to FIG. 3, comparator 12B is similar or identical to comparator 12A of FIG. 2 except that comparator 12B of FIG. 3 includes degeneration resistors R2 and R3 coupled between the upper terminal of bias current source 16 and the sources of input transistors MN2 and MN3, respectively, and also includes degeneration resistors R0 and R1 coupled between the upper terminal of current source 17 and the sources of input transistors MN4 and MN5, respectively.

In FIG. 3, the differential threshold and hysteresis control voltage is produced by the output of a control DAC 14. The differential outputs of control DAC 14 are coupled to supply both $Vref^+$ and $Vref^-$ (including their differential voltage and common-mode voltage components) to the gates of input transistors MN4 and MN5, respectively, to control either or both the switching threshold voltage and hysteresis voltage of comparator 12B. DAC 14 generates a differential output voltage having a fixed common mode component, e.g. 1 or 2 V. The digital input of threshold/hysteresis control DAC 14 is received via digital input bus 24 coupled to the output of a digital control circuit 23. Digital control circuit 23 has one input coupled by conductor 19 to receive the comparator output voltage Vout, another input coupled to receive the desired switching threshold level information represented by the digital input THRESHOLD LEVEL, at which comparator 12B is intended to switch if there is no hysteresis. Digital control circuit 23 has another input coupled to receive the desired hysteresis level represented by the digital input HYSTERESIS, which establishes the upper and lower switching voltages of comparator 12B if it has any hysteresis.

Hysteresis control is achieved by controlling DAC 14 in FIG. 3 in response to comparator output voltage Vout. For example, if digital control logic 23 produces an input code on bus 24 such that DAC 14 produces an upper comparator switching point equal to the +105 millivolts, as illustrated by the upper horizontal dashed line in FIG. 4, then Vout switches from a "0" to a "1" when Vin increases to a value slightly greater than +105 millivolts. This causes digital control logic 23 to produce an input code on bus 24 such that DAC 14 produces a lower comparator switching point equal to the +95 millivolts, as illustrated by the lower horizontal dashed line in FIG. 4. Then Vout switches from the "1" to a "0" when Vin decreases to a value slightly less than +95 millivolts.

Thus, digital control logic 23 controls the digital input code of DAC 14 in response to Vout, THRESHOLD LEVEL, and HYSTERESIS to thereby provide adjustable values of comparator threshold and hysteresis.

The present invention provides adjustable, well controlled comparator threshold voltages within a wide range of values, and also provides adjustable hysteresis in a comparator. One or both of the comparator threshold voltage and hysteresis voltage can be modified "on the fly" during normal comparator operation. These advantages make it possible to avoid use of additional analog circuits to accomplish the same results as an adjustment of the comparator threshold and/or adjustment of the hysteresis in conjunction with conventional comparators.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, to implement a single ended comparator, one of the voltage signal inputs and one of the threshold reference voltage inputs can be connected to ground. As another example, the various transistors is illustrated in a described embodiments could be bipolar PNP transistors, NPN transistors, or P-channel MOS transistors in the differential input transistor pairs.

What is claimed is:

1. A comparator comprising:
   a first differential input stage including:
      a first tail current source conducting a first tail current;
      a first load circuit;
      a first input transistor having a control electrode coupled to receive a first input voltage, a first electrode coupled to the first tail current source, and a second electrode coupled to the load circuit; and
      a second input transistor having a control electrode coupled to receive a second input voltage, a first electrode coupled to the first tail current source, and a second electrode coupled to the first load circuit;
   a second differential input stage including:
      a second tail current source conducting a second tail current;
      a third input transistor having a control electrode coupled to receive a first reference voltage, a first electrode coupled to the second tail current source, and a second electrode coupled to the first load circuit; and
      a fourth input transistor having a control electrode coupled to receive a second reference voltage, a first electrode coupled to the second tail current source, and a second electrode coupled to the first load circuit;
   an output stage producing a comparator output voltage and having an input coupled to receive an output produced by the first and second differential input stages;
   a buffer that is coupled to the output stage;
   a first switch having an input electrode, a control electrode, a first output electrode, and a second output electrode, wherein the control electrode of the first switch is directly coupled to the buffer, and wherein the first input electrode of the first switch receives a first hysteresis voltage, and wherein the first output electrode of the first switch is coupled to the control electrode of the third input transistor; and
   a second switch having an input electrode, a control electrode, a first output electrode, and a second output electrode, wherein the control electrode of the second switch is directly coupled to the buffer, and wherein the first input electrode of the second switch receives a second hysteresis voltage, and wherein the first output electrode of the second switch is coupled to the control electrode of the fourth input transistor.

2. The comparator of claim 1 wherein an amount of hysteresis is partly determined by a ratio between the current produced by the first tail current source and the current produced by the second tail current source.

3. The comparator of claim 1 wherein the amount of a switching threshold voltage is partly determined by a ratio between the current produced by the first tail current source and the current produced by the second tail current source, and wherein an amount of hysteresis of the comparator is also partly determined by the ratio between the current produced by the first tail current source and the current produced by the second tail current source.

4. The comparator of claim 1 wherein the first, second, third and fourth input transistors are N-channel transistors.

5. The comparator of claim 4 wherein the first load circuit includes a first current mirror.

6. The comparator of claim 5 wherein the first current mirror includes a first P-channel current mirror input transistor having a gate and drain coupled to a drain of the first input transistor and to a gate of a first P-channel current mirror output transistor having a drain coupled to a drain of the second input transistor and to an input of the output circuit.

7. The comparator of claim 6 wherein the output circuit includes a second load circuit.

8. The comparator of claim 7 wherein the second load circuit includes a N-channel second current mirror input transistor having a gate and drain coupled to a drain of a P-channel fifth input transistor and to a gate of a N-channel second current mirror output transistor having a drain coupled to a drain of a P-channel sixth input transistor.

9. The comparator of claim 1 wherein the current produced by the first tail current source is equal to the current produced by the second tail current source.

10. The comparator of claim 1 wherein the current produced by the first tail current source is substantially greater than the current produced by the second tail current source.

11. The comparator of claim 1 including first and second degeneration resistors coupled between the first tail current source and the first electrodes of the first and second input transistors, respectively, and also including third and fourth degeneration resistors coupled between the second tail current source and the first electrodes of the third and fourth input transistors, respectively, to ensure operation of the first, second, third, and fourth input transistors in their linear regions.

12. An apparatus comprising:
    a first voltage rail;
    a second voltage rail;
    a first differential input stage including:
       a first current mirror that is coupled to the first voltage rail;
       a first field effect transistor (FET) that is coupled to the first current mirror at its drain;
       a second FET that is coupled to the first current mirror at its drain;
       a first set of resistors coupled between the sources of the first and second FETs; and
       a first current source that is coupled between the at least one of the resistors from the first set and the second voltage rail;
    a second differential input stage including:
       a third FET that is coupled to the first current mirror at its drain;
       a fourth FET that is coupled to the first current mirror at its drain;

a second set of resistors coupled between the sources of the first and second FETs; and a second current source that is coupled between the at least one of the resistors from the second set and the second voltage rail;

an output stage including:
- a second current mirror that is coupled to the second voltage rail;
- a fifth FET that is coupled to the first voltage rail at its source, that is coupled to the first current mirror at its gate, and that is coupled to the second current mirror at its drain; and
- a sixth FET that is coupled to the first voltage rail at its source, that is coupled to the first current mirror at its gate, and that is coupled to the second current mirror at its drain;

a buffer that is coupled to the drain of the sixth FET;

a first switch having an input electrode, a control electrode, a first output electrode, and a second output electrode, wherein the control electrode of the first switch is directly coupled to the buffer, and wherein the first input electrode of the first switch receives a first hysteresis voltage, and wherein the first output electrode of the first switch is coupled to the gate of the third FET; and a second switch having an input electrode, a control electrode, a first output electrode, and a second output electrode, wherein the control electrode of the second switch is directly coupled to the buffer, and wherein the first input electrode of the second switch receives a second hysteresis voltage, and wherein the first output electrode of the second switch is coupled to the gate of the fourth FET.

13. The apparatus of claim 12, wherein the fifth and sixth FETs are P-channel MOSFETs.

14. The apparatus of claim 12, wherein the first, second, third, and fourth FETs are N-channel MOSFETs.

* * * * *